US011107983B2

(12) United States Patent
Fu et al.

(10) Patent No.: US 11,107,983 B2
(45) Date of Patent: Aug. 31, 2021

(54) RESISTIVE RANDOM ACCESS MEMORY ARRAY AND MANUFACTURING METHOD THEREOF

(71) Applicant: Winbond Electronics Corp., Taichung (TW)

(72) Inventors: Chih-Cheng Fu, New Taipei (TW); Ming-Che Lin, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 17/060,300

(22) Filed: Oct. 1, 2020

(65) Prior Publication Data

US 2021/0104666 A1 Apr. 8, 2021

(30) Foreign Application Priority Data

Oct. 5, 2019 (TW) .................................. 108136139

(51) Int. Cl.
*H01L 45/00* (2006.01)
*H01L 27/24* (2006.01)
*G11C 13/00* (2006.01)

(52) U.S. Cl.
CPC ........ *H01L 45/1246* (2013.01); *G11C 13/004* (2013.01); *G11C 13/0007* (2013.01); *G11C 13/0069* (2013.01); *H01L 27/2463* (2013.01); *H01L 45/08* (2013.01); *H01L 45/1233* (2013.01); *H01L 45/1253* (2013.01); *H01L 45/146* (2013.01); *H01L 45/1675* (2013.01); *G11C 2013/0045* (2013.01); *G11C 2013/0078* (2013.01)

(58) Field of Classification Search
CPC . H01L 45/1246; H01L 27/2463; H01L 45/08; H01L 45/1233; H01L 45/1253; H01L 45/1675; H01L 45/146; G11C 13/0007; G11C 13/004; G11C 13/0069; G11C 2013/0078; G11C 2013/0045; G11C 2213/32; G11C 2213/55; G11C 2213/34; G11C 2213/51
See application file for complete search history.

(56) References Cited

U.S. PATENT DOCUMENTS

| 8,835,895 | B2 | 9/2014 | Sumino et al. |
| 9,287,181 | B2 * | 3/2016 | Tseng ............. H01L 21/823821 |
| 9,966,138 | B2 | 5/2018 | Shifren et al. |
| 10,283,564 | B1 * | 5/2019 | Liu ..................... H01L 27/2463 |
| 2018/0233665 | A1 * | 8/2018 | Chen ...................... H01L 45/12 |

(Continued)

FOREIGN PATENT DOCUMENTS

CN 102104110 A 6/2011

*Primary Examiner* — Tri M Hoang
(74) *Attorney, Agent, or Firm* — Muncy, Geissler, Olds & Lowe, P.C.

(57) ABSTRACT

A RRAM array and its manufacturing method are provided. The RRAM array includes a substrate having an array region which has a first region and a second region. The RRAM array includes a bottom electrode layer on the substrate, an oxygen ion reservoir layer on the bottom electrode layer, a diffusion barrier layer on the oxygen ion reservoir layer, a resistance switching layer on the diffusion barrier layer, and a top electrode layer on the resistance switching layer. The diffusion barrier layer in the first region is different from the diffusion barrier layer in the second region.

17 Claims, 6 Drawing Sheets

(56) References Cited

U.S. PATENT DOCUMENTS

| | | | |
|---|---|---|---|
| 2019/0067567 A1* | 2/2019 | Tseng | G11C 13/0069 |
| 2019/0164602 A1* | 5/2019 | Tu | G11C 13/0007 |
| 2019/0165266 A1* | 5/2019 | Trinh | H01L 45/146 |
| 2020/0098985 A1* | 3/2020 | Trinh | H01L 45/146 |
| 2020/0106011 A1* | 4/2020 | Chen | H01L 45/146 |

* cited by examiner

RESISTIVE RANDOM ACCESS MEMORY ARRAY AND MANUFACTURING METHOD THEREOF

CROSS REFERENCE TO RELATED APPLICATIONS

This application claims priority of Taiwan Patent Application No. 108136139, filed on Oct. 5, 2019, the entirety of which is incorporated by reference herein.

BACKGROUND OF THE INVENTION

Field of the Invention

The present disclosure relates to a memory device, and in particular, it relates to a resistive random access memory (RRAM) array and a method for manufacturing the RRAM array.

Description of the Related Art

In the conventional RRAM, there are a plurality of memory cells in the array region of a chip, and each memory cell includes a patterned bottom electrode layer, a patterned resistance switching layer, and a patterned top electrode layer. When a forming voltage or a writing voltage is applied to the memory cell, the oxygen ions are driven by the voltage to leave from the resistance switching layer. The equivalent positively charged oxygen vacancies remaining in the resistance switching layer form a conductive path (or a conductive filament), switching the resistance switching layer from a high-resistance state to a low-resistance state. When an erasing voltage is applied, the oxygen ions return to the resistance switching layer and combine with the equivalent positively charged oxygen vacancies. Therefore, the aforementioned conductive path disappears, and the resistance switching layer is switched from the low-resistance state to the high-resistance state. Generally speaking, the high-resistance state corresponds to the logic state "0", and the low-resistance state corresponds to the logic state "1".

When a specific operating voltage is applied to a chip, the difference between the maximum value and the minimum value of the current values read from these memory cells is defined as the "operating window" of this chip at this specific operating voltage. In a conventional RRAM, each layer on the same chip usually has a uniform thickness, so that the high-resistance state and low-resistance state of these memory cells are distributed in a specific range. It is desirable to make the aforementioned operating window as small as possible, so that the logical states "0" and "1" can be distinguished easily. Therefore, the conventional RRAM is limited by a small operating window and the above-mentioned specific range, which is disadvantageous to the configuration of multi-state memory.

In some applications (for example, in artificial intelligence, encryption, etc.), a multi-state memory requires a larger operating window. Furthermore, in these applications, it is preferred that the current value read from these memory cells be difficult to predict. That is, it is desirable that the memory cells are more random. However, in an existing RRAM, the operating window and the randomness are not sufficient to meet the needs of applications such as artificial intelligence.

In order to increase the operating window and randomness of the RRAM array, a conventional method is to use different control circuits to apply different voltages to the memory cells at different positions. However, this method requires a complex circuit design, which greatly increases the complexity of the process, the production time, and the production cost. Furthermore, this additional control circuit will also occupy a larger available space, which is disadvantageous to miniaturization of the memory device.

In the memory industry, in order to meet the needs of artificial intelligence, encryption, and other applications, and in order to reduce the complexity of the process, the production time, and the production cost, there is still a need to improve the RRAM array and its process.

BRIEF SUMMARY OF THE INVENTION

The disclosure provides a method for manufacturing a RRAM array. The manufacturing method can significantly increase the operating window and randomness of the RRAM array, and can reduce the complexity of the process, the production cost, and the production time.

In accordance with some embodiments of the present disclosure, a RRAM array is provided. The RRAM array includes a substrate having an array region which includes a first region and a second region. The RRAM array includes a bottom electrode layer located on the substrate, an oxygen ion reservoir layer located on the bottom electrode layer, a diffusion barrier layer located on the oxygen ion reservoir layer, a resistance switching layer located on the diffusion barrier layer, and a top electrode layer located on the resistance switching layer. The diffusion barrier layer located in the first region is different from the diffusion barrier layer located in the second region.

In accordance with some embodiments of the present disclosure, a method for manufacturing a RRAM array is provided. The method includes providing a substrate having an array region which includes a first region and a second region. The method includes forming a bottom electrode layer on the substrate, forming an oxygen ion reservoir layer on the bottom electrode layer, forming a diffusion barrier layer on the oxygen ion reservoir layer, forming a resistance switching layer on the diffusion barrier layer, and forming a top electrode layer on the resistance switching layer. The diffusion barrier layer located in the first region is different from the diffusion barrier layer located in the second region.

In the manufacturing method of the RRAM array provided by the embodiments of the present invention, the diffusion barrier layers located in different memory cells have different thicknesses and/or materials. Therefore, the operating window and randomness of the RRAM can be significantly increased. In addition, in the manufacturing method of the RRAM array provided by the embodiments of the present invention, no additional control circuit is used. Therefore, the complexity of the process, the production cost, and the production time can be reduced.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1A:
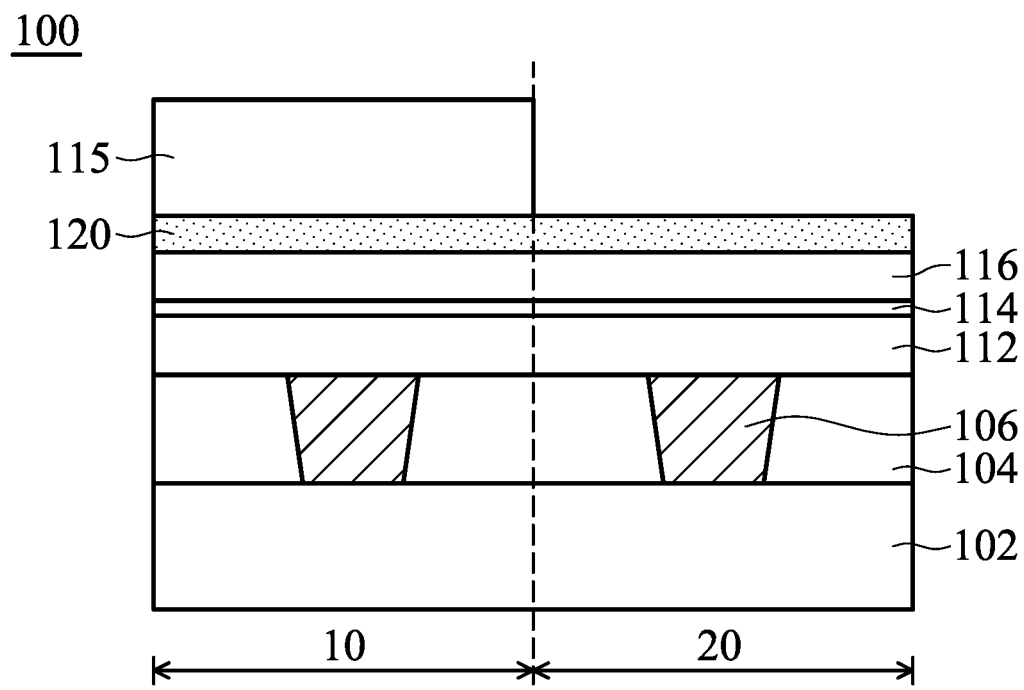
FIGS. 1A-1F are cross-sectional views corresponding to various steps of manufacturing a RRAM array in accordance with some embodiments.

The present disclosure is made for the purpose of illustrating the general principles of the invention and should not be taken in a limiting sense. The scope of the invention is best determined by reference to the appended claims. The present disclosure is best understood from the following detailed description when read with the accompanying figures. It should be noted that, in accordance with the standard practice in the industry, various features are not drawn to scale. In fact, the relative dimensions of the various features may be arbitrarily increased or reduced for clarity of discussion. In addition, the present disclosure may repeat reference numerals and/or letters in the various examples. This repetition is for the purpose of simplicity and clarity and does not in itself dictate a relationship between the various embodiments and/or configurations discussed.

FIGS. 1A-1F are cross-sectional views corresponding to various steps of manufacturing a RRAM array 100 in accordance with some embodiments of the present invention. Referring to FIG. 1A, a substrate 102 is provided, and an array region of the substrate 102 includes a first region 10 and a second region 20. Next, an insulating layer 104 is formed on the substrate 102. The material of the substrate 102 may include a bulk semiconductor substrate (for example, a silicon substrate), a compound semiconductor substrate (for example, a group IIIA-VA semiconductor substrate), a silicon on insulator (SOI) substrate, and the like. The substrate 102 may be a doped or undoped semiconductor substrate. In some embodiments, the substrate 102 is a silicon substrate. The insulating layer 104 may include a suitable insulating material, such as nitride, oxide, or oxynitride. In some embodiments, the insulating layer 104 is silicon oxide.

Next, a patterning process is performed on the insulating layer 104 to form an opening. A metal material is filled into the opening, and the excess metal material on the insulating layer 104 is removed by a planarization process (for example, a chemical mechanical polishing process) to form a contact plug 106 in the insulating layer 104. In some embodiments, the contact plug 106 is a single-layer structure and includes tungsten, aluminum, copper, other suitable metals, or a combination thereof. In other embodiments, the contact plug 106 includes a conductive layer and a liner conformally formed inside the opening. The liner can improve the adhesion between the conductive layer and the substrate 102 or the insulating layer 104, and can prevent metal atoms from diffusing into the substrate 102 or the insulating layer 104. The material of the liner may include titanium, titanium nitride, tungsten nitride, tantalum or tantalum nitride, other suitable conductive materials, or a combination thereof. The material of the conductive layer may include tungsten, aluminum, copper, other suitable metals, or a combination thereof.

Next, a bottom electrode layer 112, an oxygen blocking layer 114, and an oxygen ion reservoir layer 116 are sequentially formed on the insulating layer 104 in the array region. A physical vapor deposition process, a chemical vapor deposition process, an atomic layer deposition process, or other suitable deposition processes may be used to form the bottom electrode layer 112, the oxygen blocking layer 114, and the oxygen ion reservoir layer 116.

The bottom electrode layer 112 may be electrically connected to other elements (not shown) through the contact plug 106. By applying a voltage to the bottom electrode layer 112 and the subsequently formed top electrode layer 134, the subsequently formed resistance switching layer 132 can be switched into different electrical resistance states. The material of the bottom electrode layer 112 may include titanium, tantalum, titanium nitride, tantalum nitride, other suitable conductive materials, or a combination thereof. The bottom electrode layer 112 may be a single-layer structure formed of a single material or a multi-layer structure formed of a plurality of different materials. In some embodiments, the bottom electrode layer 112 is a dual-layer structure which includes a titanium layer and a titanium nitride layer formed thereon.

In order to prevent the oxygen ions from entering the bottom electrode layer 112 and thereby causing oxidation of the bottom electrode layer 112, an oxygen blocking layer 114 may be disposed between the bottom electrode layer 112 and the oxygen ion reservoir layer 116 to prevent the oxygen ions located in the oxygen ion reservoir layer 116 from entering the bottom electrode layer 112. The material of the oxygen blocking layer 114 may include aluminum oxide ($Al_xO_y$), hafnium oxide ($Hf_xO_y$), titanium oxide ($Ti_xO_y$), or titanium oxynitride ($Ti_xO_yN_z$). In some embodiments, the material of the oxygen blocking layer 114 is aluminum oxide ($Al_2O_3$).

The oxygen ion reservoir layer 116 can be used to store the oxygen ions from the subsequently formed resistance switching layer. The material of the oxygen ion reservoir layer 116 may include titanium (Ti), tantalum (Ta), hafnium (Hf), zirconium (Zr). In some embodiments, the material of the oxygen ion reservoir layer 116 is titanium. In some embodiments, the thickness of the oxygen ion reservoir layer 116 is 15-35 nm.

Next, a diffusion barrier material is deposited on the oxygen ion reservoir layer 116 to form the diffusion barrier layer 120. The diffusion barrier layer 120 can be used to block the oxygen ions, and can make the moving of the oxygen ions become more difficult. The oxygen ions stored in the oxygen ion reservoir layer 116 are less likely to diffuse back into the subsequently formed resistance switching layer 132 (shown in FIG. 1D). Therefore, the memory cell can be stably maintained in the low-resistance state. The material of the diffusion barrier layer 120 may include aluminum oxide ($Al_xO_y$), titanium oxide ($Ti_xO_y$), tantalum oxide ($Ta_xO_y$), hafnium oxide ($Hf_xO_y$), nickel oxide ($Ni_xO_y$), zirconium oxide ($Zr_xO_y$), or a combination thereof. In some embodiments, the material of the diffusion barrier layer 120 is aluminum oxide ($Al_2O_3$).

Next, a mask layer 115 is formed and patterned, so that the first region 10 is covered and the second region 20 is exposed. The mask layer 115 may be any suitable material (for example, photoresist), and the mask layer 115 may be patterned by any suitable process.

Figure 1B:
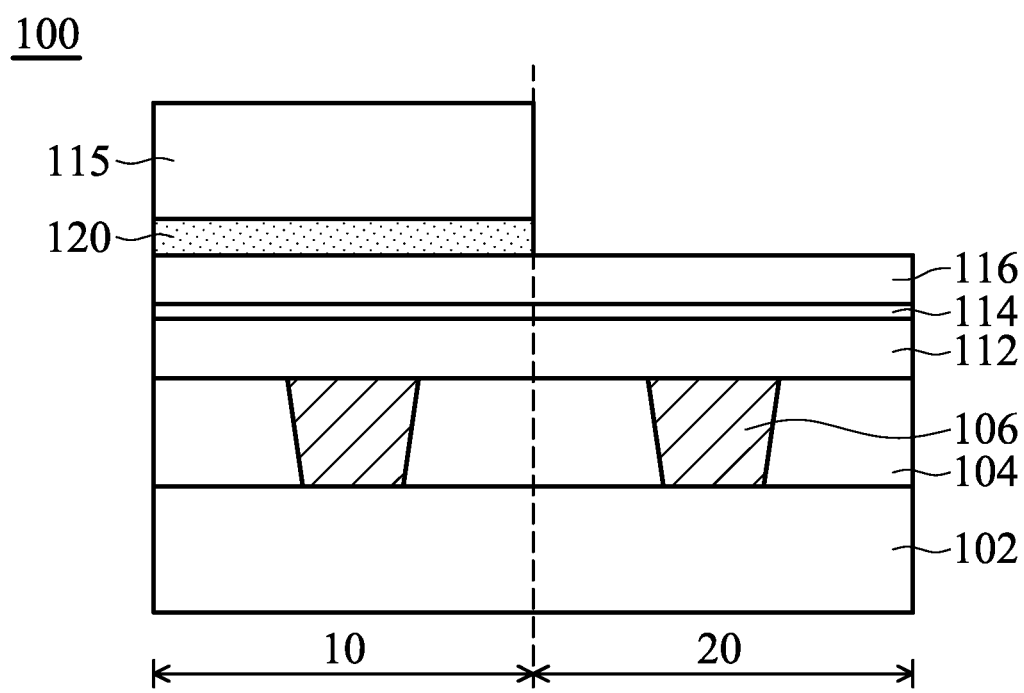

Referring to FIG. 1B, a first etching process is performed to remove the diffusion barrier layer 120 located in the second region 20. After the first etching process, the diffusion barrier layer 120 located in the first region 10 is not removed but remains. The first etching process may be a dry etching process, a wet etching process, or a combination thereof.

Figure 1C:
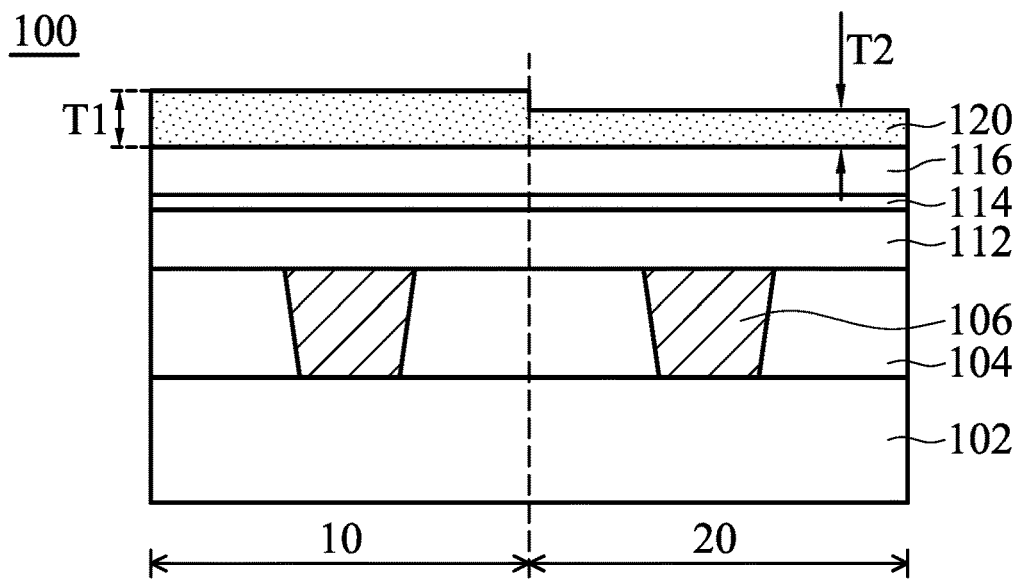

Referring to FIG. 1C, the mask layer 115 is removed to expose the diffusion barrier layer 120 in the first region 10. Then, the diffusion barrier material is deposited again in the array region to form the diffusion barrier layer 120 in the first region 10 and the second region 20. The diffusion barrier layer 120 located in the first region 10 has a first thickness T1, the diffusion barrier layer 120 located in the second region 20 has a second thickness T2, and the first thickness T1 is greater than the second thickness T2.

Figure 1D:
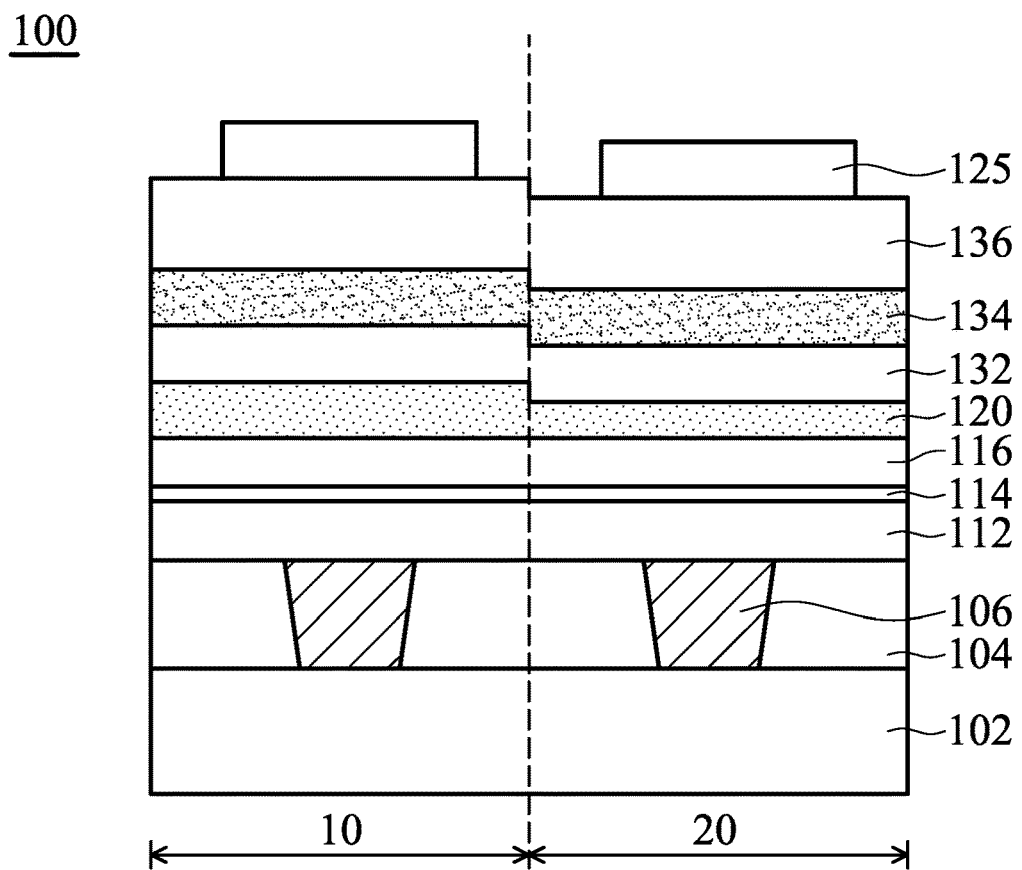

Referring to FIG. 1D, a resistance switching layer 132, a top electrode layer 134, and a hard mask layer 136 are sequentially formed on the diffusion barrier layer 120 in the array region. A physical vapor deposition process, a chemical vapor deposition process, an atomic layer deposition process, or other suitable deposition processes may be used to form the resistance switching layer 132, the top electrode layer 134, and the hard mask layer 136. The resistance switching layer 132, the top electrode layer 134, and the hard mask layer 136 are all conformally deposited on the diffusion barrier layer 120. Therefore, the resistance switching layer 132 (the top electrode layer 134 or the hard mask layer 136) has the same thickness in the first region 10 and the second region 20.

The resistance switching layer 132 may determine the electrical resistance states of the memory cell. Furthermore, when a specific voltage is applied, the electrical resistance values of the resistance switching layer 132 may determine the logic states of the memory cell. The material of the resistance switching layer 132 may include transition metal oxide, for example, aluminum oxide ($Al_xO_y$), titanium oxide ($Ti_xO_y$), nickel oxide ($Ni_xO_y$), tantalum oxide ($Ta_xO_y$), hafnium oxide ($Hf_xO_y$), or zirconium oxide ($Zr_xO_y$). In some embodiments, the material of the resistance switching layer 132 is hafnium oxide ($HfO_2$). In order to block the oxygen ions from returning to the resistance switching layer 132 from the oxygen ion reservoir layer 116, the material of the diffusion barrier layer 120 may be different from that of the resistance switching layer 132.

The material of the top electrode layer 134 may include titanium, tantalum, titanium nitride, tantalum nitride, other suitable conductive materials, or a combination thereof. The top electrode layer 134 may be a single-layer structure formed of a single material or a multi-layer structure formed of a plurality of different materials. In some embodiments, the top electrode layer 134 is a single-layer structure formed of titanium nitride.

The hard mask layer 136 can protect the layers below it, and can reduce or avoid damage to the layers below it during the subsequent processes. The hard mask layer 136 may be nitride, oxynitride, or carbonitride. For example, the hard mask layer 136 may be silicon oxynitride, silicon nitride, or silicon dioxide. In some embodiments, the hard mask layer 136 is silicon oxynitride.

Next, a mask layer 125 is formed and patterned to cover the first region 10 and the second region 20 partially. The material of the mask layer 125 may be the same as or similar to that of the mask layer 115.

Figure 1E:
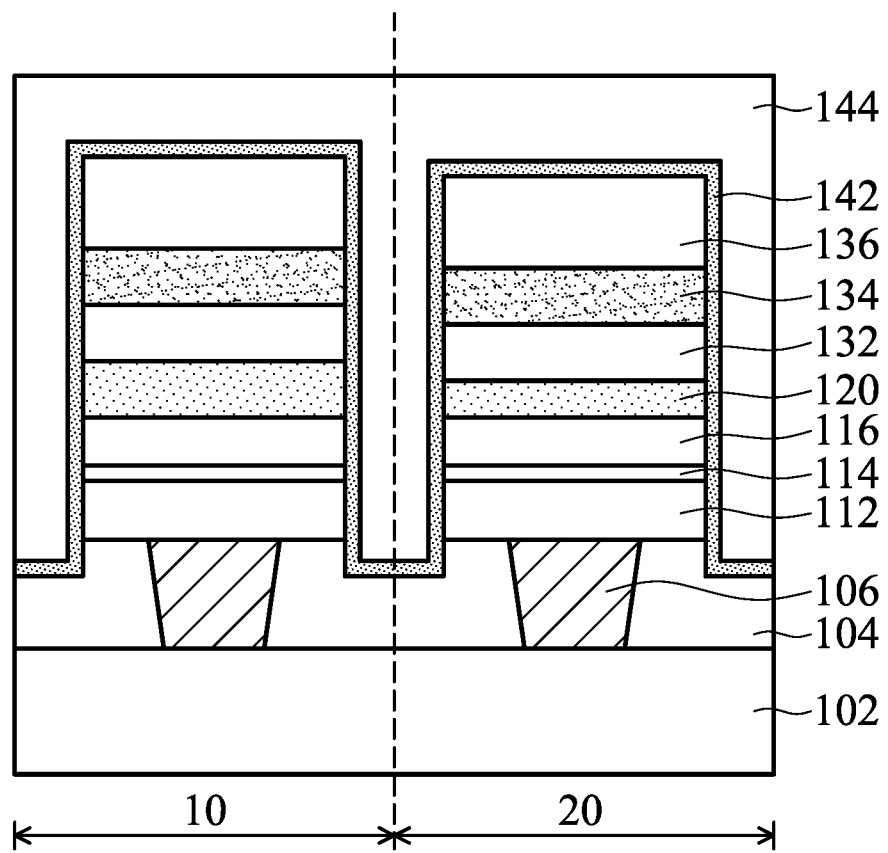

Referring to FIG. 1E, a second etching process is performed to form a first stacked structure and a second stacked structure in the first region 10 and the second region 20, respectively. Each of the first stacked structure and the second stacked structure includes the bottom electrode layer 112, the oxygen blocking layer 114, the oxygen ion reservoir layer 116, the diffusion barrier layer 120, the resistance switching layer 132, the top electrode layer 134, and the hard mask layer 136. In order to avoid a short circuit between the first stacked structure and the second stacked structure, the etching depth of the second etching process may be lower than the top surface of the insulating layer 104. In some embodiments, the second etching process is a dry etching process.

Next, a protective layer 142 is formed in the array region to cover the first stacked structure and the second stacked structure conformally. The protective layer 142 may be formed by an atomic layer deposition. The protective layer 142 may be a single-layer structure formed of a single material or a multi-layer structure formed of a plurality of different materials. In some embodiments, the protective layer 142 is a dual-layer structure formed by a hydrogen-oxygen barrier layer and a capping layer formed on the hydrogen-oxygen barrier layer. In such embodiments, the hydrogen-oxygen barrier layer can prevent hydrogen and oxygen from entering the substrate 102, the bottom electrode layer 112, the oxygen blocking layer 114, the oxygen ion reservoir layer 116, the diffusion barrier layer 120, the resistance switching layer 132, and the top electrode layer 134. Therefore, the degradation or failure of the RRAM array can be avoided. The material of the hydrogen-oxygen barrier layer may be metal oxide (for example, aluminum oxide), metal nitride, metal oxynitride, nitride, oxynitride, or a combination thereof. The capping layer can reduce or prevent the damage of the memory cells during the subsequent processes. The material of the capping layer may be nitride or oxide, for example, silicon dioxide. In other embodiments, the function and material of the hydrogen-oxygen barrier layer may be the same as or similar to the function and material of the capping layer. In the present embodiment, the protective layer 142 is a single-layer structure formed of aluminum oxide ($Al_2O_3$).

Next, a dielectric layer 144 is formed on the substrate 102. The dielectric layer 144 covers the first stacked structure and the second stacked structure, and the dielectric layer 144 fills the gap between the first stacked structure and the second stacked structure. Thereafter, a planarization process is performed, so that the dielectric layer 144 has a flat top surface. In some embodiments, the material of the dielectric layer 144 is an oxide, and is formed by a chemical vapor deposition.

Figure 1F:
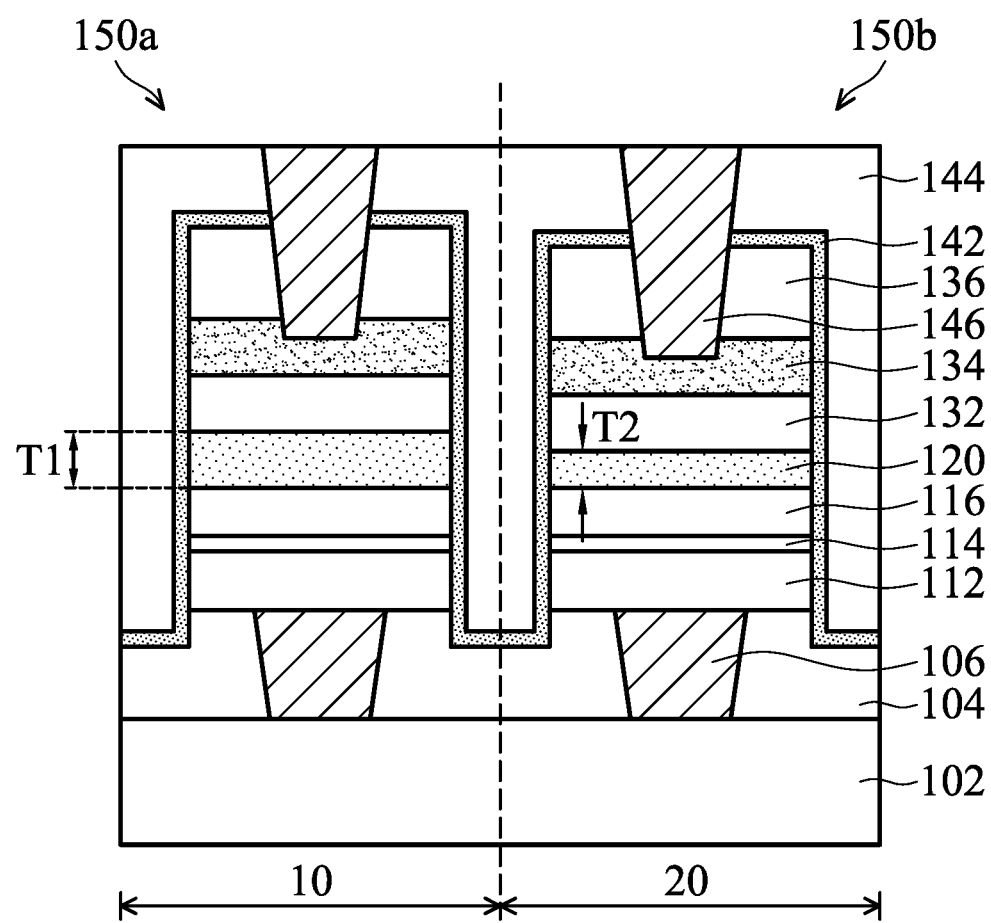

Referring to FIG. 1F, two openings are formed on the first stacked structure and the second stacked structure, respectively. Then, conductive material is filled into the openings to form two conductive plugs 146 on the first stacked structure and the second stacked structure, respectively. The conductive plug 146 may be similar to the contact plug 106 and will not be described in detail herein. After that, other conventional processes can be performed to complete the RRAM array 100. These conventional processes will not be described in detail herein.

In some embodiments, a RRAM array 100 is provided. Referring to FIG. 1F, the RRAM array 100 includes the substrate 102, and the array region of the substrate 102 includes the first region 10 and the second region 20. The first memory cell 150a is located in the first area 10, and the second memory cell 150b is located in the second area 20. Each of the first memory cell 150a and the second memory cell 150b includes the bottom electrode layer 112, the oxygen blocking layer 114, the oxygen ion reservoir layer 116, the diffusion barrier layer 120, the resistance switching layer 132, the top electrode layer 134, the hard mask layer 136, and the conductive plug 146 stacked sequentially from bottom to top. The diffusion barrier layer 120 of the first memory cell 150a is different from the diffusion barrier layer 120 of the second memory cell 150b. Accordingly, the operating windows of the first memory cell 150a and the second memory cell 150b are different. In the present embodiment, the diffusion barrier layer 120 of the first memory cell 150a has a first thickness T1, the diffusion barrier layer 120 of the second memory cell 150b has a second thickness T2, and the first thickness T1 is greater than the second thickness T2. Except for the thickness of the diffusion barrier layer 120, the other layers of the first memory cell 150a are the same as those of the second memory cell 150b.

When a voltage is applied to the memory cell having a low-resistance state, a part of the oxygen ions remaining in the oxygen ion reservoir layer 116 returns to the resistance switching layer 132. Therefore, the conductive path is reduced, and the electrical resistance value of the memory cell is increased. As the number of the oxygen ions returning to the resistance switching layer 132 is different, the electrical resistance values of the memory cells are also different from each other. The thickness of the diffusion barrier layer 120 is one of the important parameters that determines the number of the oxygen ions returning to the resistance switching layer 132. If the thickness of the diffusion barrier layer 120 is larger, it is more difficult for the oxygen ions to pass through the diffusion barrier layer 120. Therefore, the number of the oxygen ions returning to the resistance switching layer 132 will be smaller, and the electrical resistance value of the memory cell will be lower. Furthermore, when the thickness of the diffusion barrier layer 120 is larger, it is more difficult for the oxygen ions to pass through the diffusion barrier layer 120, so the operating window of the RRAM array 100 is also smaller.

When the RRAM array 100 consists of the first memory cells 150a, the operating window is in a first range. When the RRAM array 100 consists of the second memory cells 150b, the operating window is in a second range. In the present embodiment, the RRAM array 100 includes the first memory cell 150a and the second memory cell 150b, and the operating window is in a third range. The third range covers the first range and the second range. In other words, the lower limit of the third range is the minimum of the first range and the second range, and the upper limit of the third range is the maximum of the first range and the second range. Therefore, the structure of the present embodiment can greatly increase the operating window of the RRAM array.

In order to verify the technical effect of the RRAM array 100 of the present embodiment, the inventors of the present application have conducted experiments. The details and results of the experiments are briefly described below.

First, RRAM arrays (A), (B), and (C) are prepared. The thickness of the diffusion barrier layers of all the memory cells in the array (A) is 0.7 nm. The thickness of the diffusion barrier layers of all the memory cells in the array (B) is 1.3 nm. The thickness of the diffusion barrier layer located in the half of the memory cells in the array (C) is 0.7 nm, and the thickness of the diffusion barrier layer located in the other half of the memory cells is 1.3 nm. Except for the thickness of the diffusion barrier layer, the other structures of the arrays (A), (B), and (C) are the same as one another.

An operating voltage of 2.5 to 3 Volt was applied to the array (A), the current values of these memory cells were read separately, and the difference between the maximum current value and the minimum current value is defined as the "operating window" of the specific operating voltage of the array (A). The same operations were performed to the arrays (B) and (C).

Experimental results show that the maximum current value and the minimum current value of the array (A) are 41 µA and 27 µA, respectively, and the operating window is 14 µA. The maximum and minimum current values of the array (B) are 46 µA and 35 µA, respectively, and the operating window is 11 µA. The maximum and minimum current values of the array (C) are 46 µA and 27 µA, respectively, and the operating window is 19 µA. This experimental result can prove that even without using an additional control circuit, the RRAM array 100 of the present embodiment can still significantly increase the operating window.

In the manufacturing method of the RRAM array 100 provided in the present embodiment, the relative positions of the first memory cell 150a and the second memory cell 150b can be changed by the pattern of the mask layer 115. In some embodiments, in the top view, the first memory cell 150a and the second memory cell 150b are adjacent to each other and staggered arranged. In other embodiments, in the top view, the arrangement of the first memory cell 150a and the second memory cell 150b is irregular or random. Therefore, even if no additional control circuit is used, the randomness of the RRAM array 100 can be significantly increased.

The method of forming the diffusion barrier layer 120 may include atomic layer deposition, chemical vapor deposition, or physical vapor deposition. In some embodiments, the diffusion barrier layer 120 is formed by the atomic layer deposition, so the first thickness T1, the second thickness T2, and the difference value (T1−T2) between the first thickness and the second thickness can be accurately controlled. In other embodiments, the diffusion barrier layer 120 is formed by the chemical vapor deposition. The chemical vapor deposition makes it easier to form the diffusion barrier layer 120 with uneven thickness, which is advantageous for increasing the randomness of the RRAM array 100. In still other embodiments, the diffusion barrier layer 120 is formed by the physical vapor deposition. The physical vapor deposition makes it easier to control the atomic ratio of the diffusion barrier material. For example, aluminum oxide can be formed with the chemical formula $Al_xO_y$, where x and y are appropriate integers, respectively.

In the present embodiment, the low-resistance state of the RRAM array 100 is configured as a multi-state for writing and reading. For example, the low-resistance state may include a first low-resistance state LRS1 and a second low-resistance state LRS2 corresponding to different logic states, respectively. Therefore, by adopting the RRAM array 100 of the present embodiment, when a setting voltage is applied to the memory cells located in the first region and the memory cells located in the second region, the current read from one of the memory cells located in the first region and the memory cells located in the second region is determined to correspond to the first low-resistance state LRS1, and the current read from another one is determined to correspond to the second low-resistance state LRS2. The electrical resistance value of the first low-resistance state LRS1 is smaller than the electrical resistance value of the second low-resistance state LRS2. In the low-resistance state, the oxygen ions are located in the oxygen ion reservoir layer 116, so the ambient temperature in the low-resistance state does not easily affect the diffusion of the oxygen ions (for example, make the oxygen ions located in the oxygen ion reservoir layer 116 return to the resistance switching layer 132). Therefore, compared with the case where the high-resistance state is configured as a multi-state for writing and reading, the RRAM array 100 of the present embodiment has a better property of high temperature data retention (HTDR). In another embodiment, the RRAM array 100 performs multi-state writing and reading only in the low-resistance state, thereby improving the property of HTDR.

If the thickness of the diffusion barrier layer 120 is controlled within an appropriate range, the oxygen ions diffused back into the resistance switching layer 132 can be reduced, which is advantageous to improving HTDR. Furthermore, if the thickness of the diffusion barrier layer 120 is controlled within an appropriate range, the operating voltage can be lowered, and the yield of the RRAM array 100 can be improved. In some embodiments, the second thickness T2 of the diffusion barrier layer 120 is 4 Å-20 Å.

To make the use of the same operating voltage for the entire wafer without additional circuit design be easier, and also make the use of the same process form all of the memory cells on the same wafer be easier, it is preferred to design the thicknesses of the diffusion barrier layer 120 as following. As a result, the memory cells with different thicknesses may use the same deposition condition or the same etching condition for forming all of the memory cells on the same wafer, thereby the complexity of the process may be decreased.

The inventors of the present application have found that the operating window of the memory cell is very sensitive to the thickness of the diffusion barrier layer 120. In other words, only a slight adjustment of the thickness (less than 1 nm) of the diffusion barrier layer 120 is required to greatly widen the operating window. If the difference value between the first thickness T1 and the second thickness T2 is controlled within an appropriate range, the operating window can be easily controlled within the required range, and the manufacturing method of the present embodiment can be easily integrated into the existing process. As shown in FIG. 1F, the diffusion barrier layer 120 located in the first region 10 has a first thickness T1, and the diffusion barrier layer 120 located in the second region 20 has a second thickness T2. In some embodiments, the ratio T1/T2 of the first thickness T1 to the second thickness T2 is 1.2-5.5.

Figure 2A:
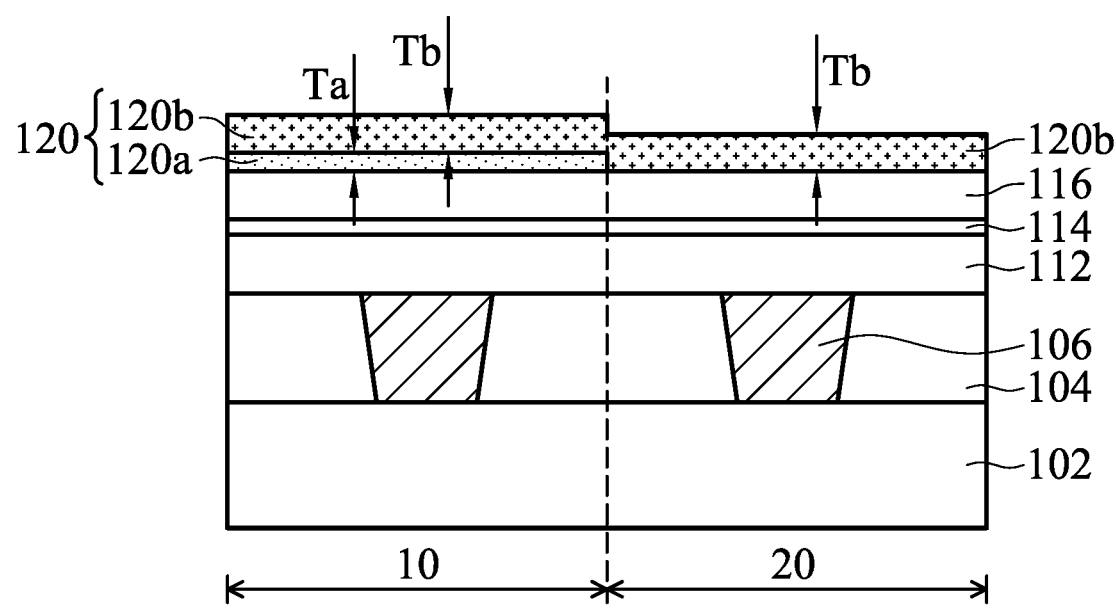
FIGS. 2A-2B are cross-sectional views corresponding various steps of manufacturing a RRAM array in accordance with other embodiments.
Figure 2B:
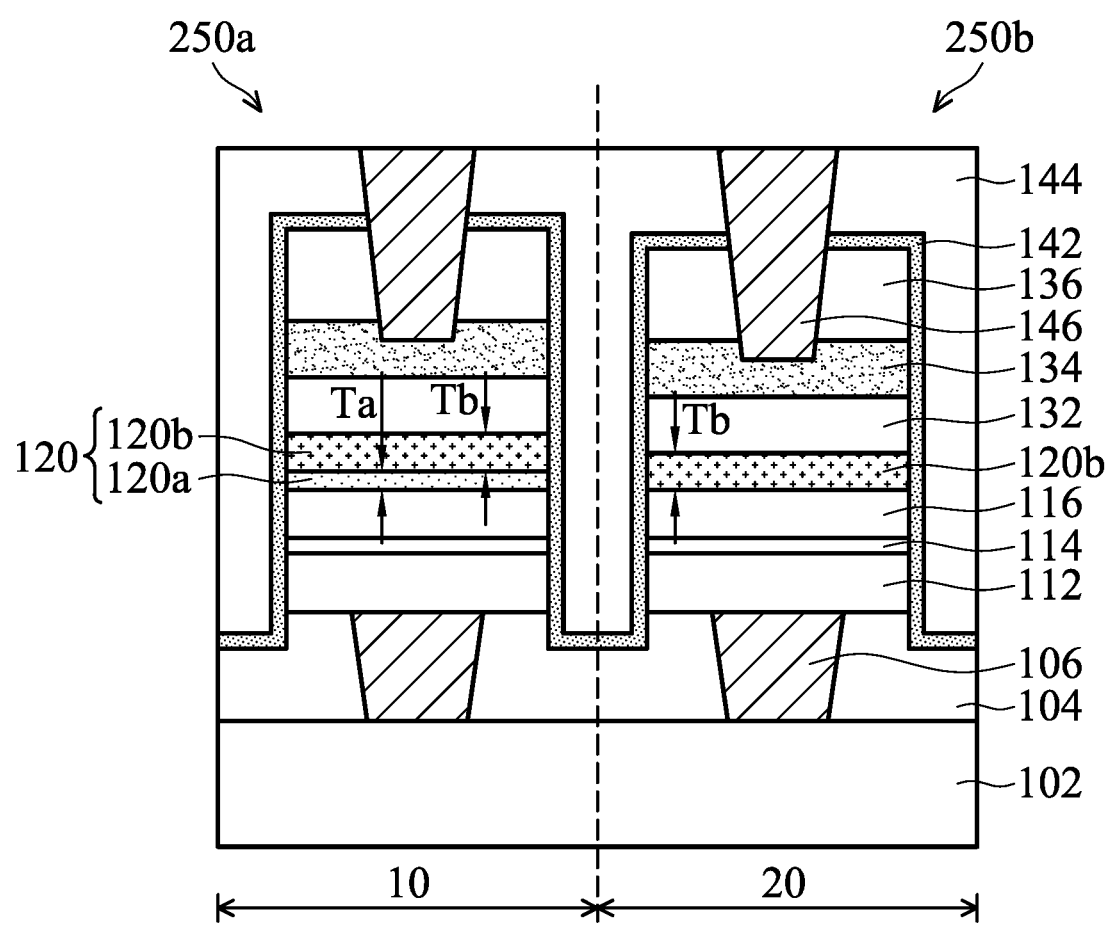

FIGS. 2A-2B are cross-sectional views corresponding various steps of manufacturing a RRAM array 200 in accordance with other embodiments. The RRAM array 200 shown in FIG. 2B is similar to the RRAM array 100 shown in FIG. 1F, and the difference is that the diffusion barrier layer 120 shown in FIG. 2B includes two different materials. In order to simplify the description, the elements and their forming process steps that are the same as those shown in FIG. 1F are not be described in detail herein.

The structure shown in FIG. 2A can be formed by the following steps. First, a first diffusion barrier material is deposited in the array region. Next, a mask layer 115 is formed and patterned, so that the first region 10 is covered and the second region 20 is exposed. Next, a first etching process as shown in FIG. 1B is performed to remove the first diffusion barrier material located in the second region 20 and to retain the first diffusion barrier material located in the first region 10 to form a first sub-layer 120a in the first region 10. Next, a second diffusion barrier material different from the first diffusion barrier material is deposited in the array region to form a second sub-layer 120b in the first region 10 and the second region 20, as shown in FIG. 2A. After the structure shown in FIG. 2A is formed, the process steps described in FIGS. 1D to 1F can be performed to complete the RRAM array 200 shown in FIG. 2B.

Referring to FIG. 2B, in the first region 10, the diffusion barrier layer 120 includes the first sub-layer 120a and the second sub-layer 120b. In the second region 20, the diffusion barrier layer 120 includes only the second sub-layer 120b, and does not include the first sub-layer 120a. In the present embodiment, the first diffusion barrier material is different from the second diffusion barrier material. Therefore, the ability of the diffusion barrier layer 120 to block the oxygen ions can be controlled by selecting the material of the diffusion barrier material. For example, in the case that the first diffusion barrier material has a better ability to block the oxygen ions than the second diffusion barrier material, even if the first sub-layer 120a has a extremely small thickness (for example, 1-2 Å), the operating window can also be greatly increased. As a result, it is advantageous to reduce the difference value of the total thickness between the first memory cell 250a and the second memory cell 250b. In some embodiments, the first diffusion barrier material is aluminum oxide ($Al_2O_3$), and the second diffusion barrier material is tantalum oxide ($Ta_2O_5$).

Referring to FIG. 2B, the thickness of the first sub-layer 120a of the diffusion barrier layer 120 is represented as Ta. The thickness Ta of the first sub-layer 120a is equal to the difference value of the total thickness between the first memory cell 250a and the second memory cell 250b. If the thickness Ta of the first sub-layer 120a is controlled within an appropriate range, the uniformity of the total thickness of the memory cells can be improved, which is advantageous to reduce the complexity of the process. In some embodiments, the thickness Ta of the first sub-layer 120a is 1 Å-10 Å.

Referring to FIG. 2B, the thickness of the second sub-layer 120b of the diffusion barrier layer 120 is represented as Tb. If the ratio (Tb/Ta) of the thickness Tb of the second sub-layer 120b to the thickness Ta of the first sub-layer 120a is controlled within an appropriate range, the operating window can be easily controlled within the required range. In some embodiments, the ratio (Tb/Ta) of the thickness Tb of the second sub-layer 120b to the thickness Ta of the first sub-layer 120a is 1.5-10.0.

It should be understood that the two memory cells shown in the cross-sectional view are only for illustration, and is not intended to limit the present invention. Based on the technical concepts provided by the embodiments of the present invention, those with ordinary knowledge in the technical field should be able to make suitable modifications. For example, before the steps described in FIG. 1D are performed, the steps described in FIG. 1B and FIG. 1C may be repeated to generate diffusion barrier layers with three different thicknesses and/or materials. In this way, the operating window and randomness of the RRAM array can be further increased. Furthermore, in another embodiment which is not shown, in the steps of forming the structure shown in FIG. 2A, after the first diffusion barrier material located in the second region 20 is removed, a mask layer is formed to cover the first region 10 and expose the second region 20. Next, a second diffusion barrier material which is different from the first diffusion barrier material is deposited in the second region 20. Therefore, the diffusion barrier layer 120 located in the first region 10 and the diffusion barrier layer 120 located in the second region 20 may be formed of two different types of diffusion barrier materials, respectively. In this way, even if the diffusion barrier layer 120 located in the first region 10 and the diffusion barrier layer 120 located in the second region 20 have the same thickness, the operating window and randomness of the RRAM array can be increased.

Furthermore, if the resistance switching layer 132 of the first memory cell 150a is made different from the resistance switching layer 132 of the second memory cell 150b, an additional control circuit is required to apply different voltages to the first memory cell 150a and the second memory cell 150b to complete the operation of setting or resetting. It is disadvantageous to miniaturization of the RRAM array. In the RRAM array provided by the embodiment of the present invention, the diffusion barrier layers located in different memory cells have different thicknesses and/or different materials. When a setting voltage or a resetting voltage is applied to the RRAM array, the first current read from the memory cell located in the first region is different from the second current read from the memory cell located in the second region, and the first current and the second current both meet a predetermined condition (i.e., a threshold current in a low-resistance state or a high-resistance state). In some embodiments, when a setting voltage is applied to the RRAM array, the first setting current read from the memory cell located in the first region is different from the second setting current read from the memory cell located in the second region, and the first setting current and the second setting current are both larger than the threshold current of the low-resistance state. Therefore, the operating window and randomness of the RRAM array can be significantly increased. In addition, the RRAM array and the manufacturing method thereof provided by the embodiments of the present invention do not need to use an additional control circuit, and can be easily integrated into an existing manufacturing process. Therefore, the complexity of the process, the production cost, and production time can be reduced.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A resistive random access memory array (RRAM), comprising:
    a substrate, wherein an array region of the substrate comprises a first region and a second region;
    a bottom electrode layer located on the substrate;
    an oxygen ion reservoir layer located on the bottom electrode layer;
    a diffusion barrier layer located on the oxygen ion reservoir layer, wherein the diffusion barrier layer located in the first region is different from the diffusion barrier layer located in the second region;
    a resistance switching layer located on the diffusion barrier layer; and
    a top electrode layer located on the resistance switching layer.

2. The RRAM array as claimed in claim 1, wherein the diffusion barrier layer located in the first region has a first thickness T1, the diffusion barrier layer located in the second region has a second thickness T2, and the first thickness T1 is greater than the second thickness T2.

3. The RRAM array as claimed in claim 1, wherein a material of the diffusion barrier layer comprises aluminum oxide, titanium oxide, tantalum oxide, hafnium oxide, nickel oxide, zirconium oxide, or a combination thereof.

4. The RRAM array as claimed in claim 2, wherein a ratio T1/T2 of the first thickness T1 to the second thickness T2 is 1.2-5.5.

5. The RRAM array as claimed in claim 1, wherein the diffusion barrier layer located in the first region comprises a first diffusion barrier material, the diffusion barrier layer located in the second region comprises a second diffusion barrier material, and the first diffusion barrier material is different from the second diffusion barrier material.

6. The RRAM array as claimed in claim 1, wherein the diffusion barrier layer located in the first region comprises a first sub-layer and a second sub-layer, the first sub-layer is located on the oxygen ion reservoir layer, and the second sub-layer is located on the first sub-layer, and wherein a material of the second sub-layer is different from a material of the first sub-layer, wherein the diffusion barrier layer located in the second region comprises the second sub-layer, and does not comprise the first sub-layer.

7. The RRAM array as claimed in claim 6, wherein the first sub-layer has a third thickness T3, the second sub-layer has a fourth thickness T4, and a ratio T4/T3 of the fourth thickness T4 to the third thickness T3 is 1.5-10.0.

8. The RRAM array as claimed in claim 1, wherein when a setting voltage or a resetting voltage is applied to the RRAM array, a first current read from the first region is different from a second current read from the second region.

9. The RRAM array as claimed in claim 8, wherein when the setting voltage is applied to the RRAM array, the first current and the second current are both larger than a threshold current of a low-resistance state.

10. The RRAM array as claimed in claim 2, wherein the diffusion barrier layer located in the first region comprises a first diffusion barrier material, the diffusion barrier layer located in the second region comprises a second diffusion barrier material, and the first diffusion barrier material is different from the second diffusion barrier material.

11. A method for manufacturing a resistive random access memory (RRAM) array, comprising:
    providing a substrate, wherein an array region of the substrate comprises a first region and a second region;
    forming a bottom electrode layer on the substrate;
    forming an oxygen ion reservoir layer on the bottom electrode layer;
    forming a diffusion barrier layer on the oxygen ion reservoir layer, wherein the diffusion barrier layer located in the first region is different from the diffusion barrier layer located in the second region;
    forming a resistance switching layer on the diffusion barrier layer; and
    forming a top electrode layer on the resistance switching layer.

12. The method for manufacturing the RRAM array as claimed in claim 11, wherein forming the diffusion barrier layer comprises:
    depositing a diffusion barrier material in the array region;
    performing a patterning process to remove the diffusion barrier material located in the second region and to retain the diffusion barrier material located in the first region; and
    depositing the diffusion barrier material in the array region again to form the diffusion barrier layer in the first region and the second region.

13. The method for manufacturing the RRAM array as claimed in claim 11, wherein forming the diffusion barrier layer comprises:
    depositing a first diffusion barrier material in the array region;
    performing a patterning process to remove the first diffusion barrier material located in the second region and to retain the first diffusion barrier material located in the first region, so that a first sub-layer is formed on the first region; and
    depositing a second diffusion barrier material in the array region to form a second sub-layer in the first region and the second region,
    wherein the first diffusion barrier material is different from the second diffusion barrier material,
    wherein in the first region, the diffusion barrier layer comprises the first sub-layer and the second sub-layer, and wherein in the second region, the diffusion barrier layer comprises the second sub-layer and does not comprise the first sub-layer.

14. The method for manufacturing the RRAM array as claimed in claim 11, wherein the diffusion barrier layer located in the first region has a first thickness T1, the diffusion barrier layer located in the second region has a second thickness T2, and the first thickness T1 is greater than the second thickness T2.

15. The method for manufacturing the RRAM array as claimed in claim 11, wherein a material of the diffusion barrier layer comprises aluminum oxide, titanium oxide, tantalum oxide, hafnium oxide, nickel oxide, zirconium oxide, or a combination thereof.

16. The method for manufacturing the RRAM array as claimed in claim 14, wherein a ratio T1/T2 of the first thickness T1 to the second thickness T2 is 1.2-5.5.

17. The method for manufacturing the RRAM array as claimed in claim 13, wherein the first sub-layer has a third thickness T3, the second sub-layer has a fourth thickness T4, and a ratio T4/T3 of the fourth thickness T4 to the third thickness T3 is 1.5-10.0.

* * * * *